United States Patent [19]

MacLennan

[11] 4,125,785
[45] Nov. 14, 1978

[54] CHARGE TRANSFER MEMORY APPARATUS

[75] Inventor: Donald J. MacLennan, Ballston Lake, N.Y.

[73] Assignee: General Electric Company, Schenectady, N.Y.

[21] Appl. No.: 878,427

[22] Filed: Feb. 16, 1978

[51] Int. Cl.² .................. G11C 19/28; H01L 29/78; H03K 5/00; G11C 11/24
[52] U.S. Cl. .................. 307/221 D; 357/24; 307/238; 365/183
[58] Field of Search ............. 357/24; 307/221 D, 238; 365/183

[56] References Cited

U.S. PATENT DOCUMENTS

| | | | |
|---|---|---|---|
| 3,934,261 | 1/1976 | Sequin | 357/24 |
| 4,001,878 | 1/1977 | Weimer | 357/24 |
| 4,041,521 | 8/1977 | Sunami et al. | 357/24 |

Primary Examiner—Gene M. Munson
Attorney, Agent, or Firm—Julius J. Zaskalicky; Joseph T. Cohen; Marvin Snyder

[57] ABSTRACT

An array of rows and columns of charge transfer stages are provided. Each of the stages have identical sets of four electrodes. In response to a first set of clocking voltages applied to the sets of four electrodes charge packets are transferred from stage to stage in the column direction. In response to a second set of clocking voltages applied to the sets of four electrodes charge packets are transferred from stage to stage in the row direction.

4 Claims, 19 Drawing Figures

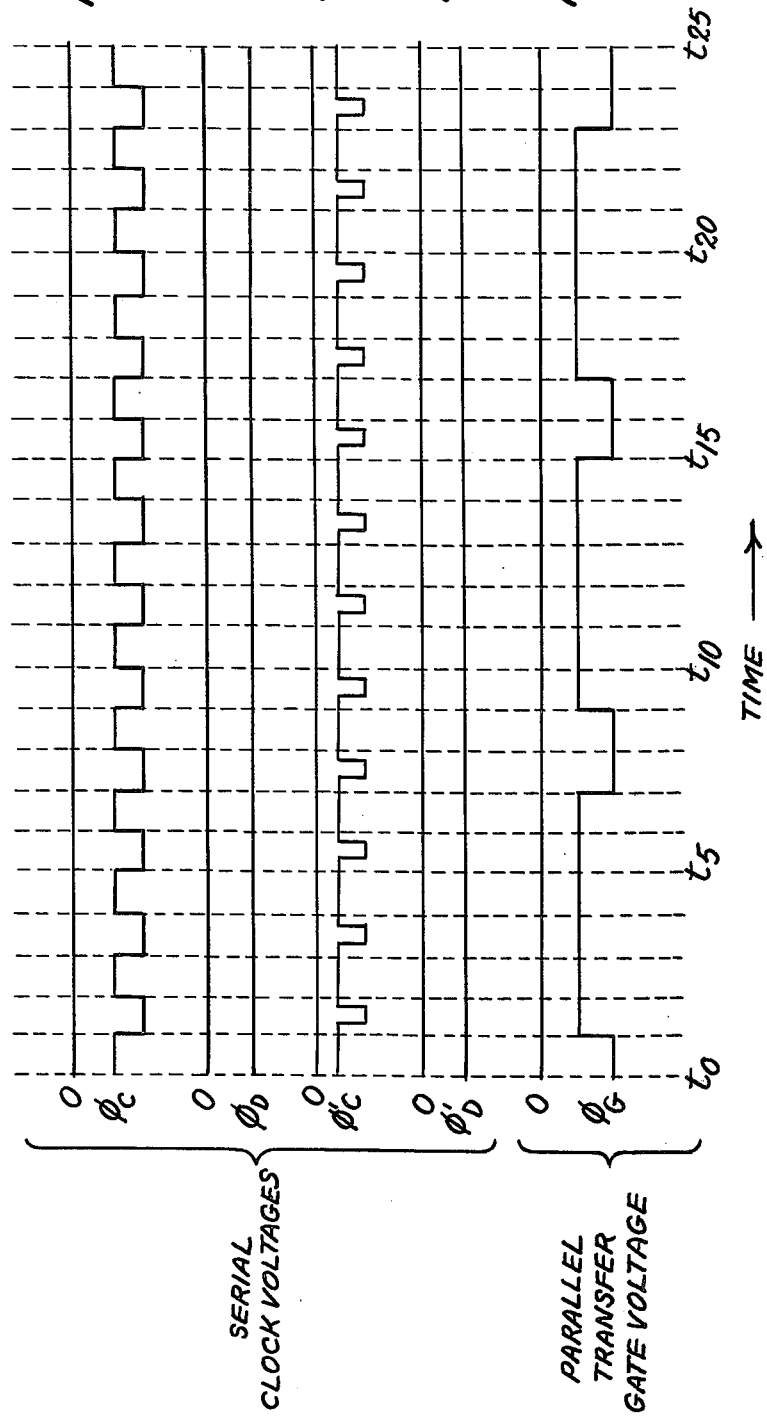

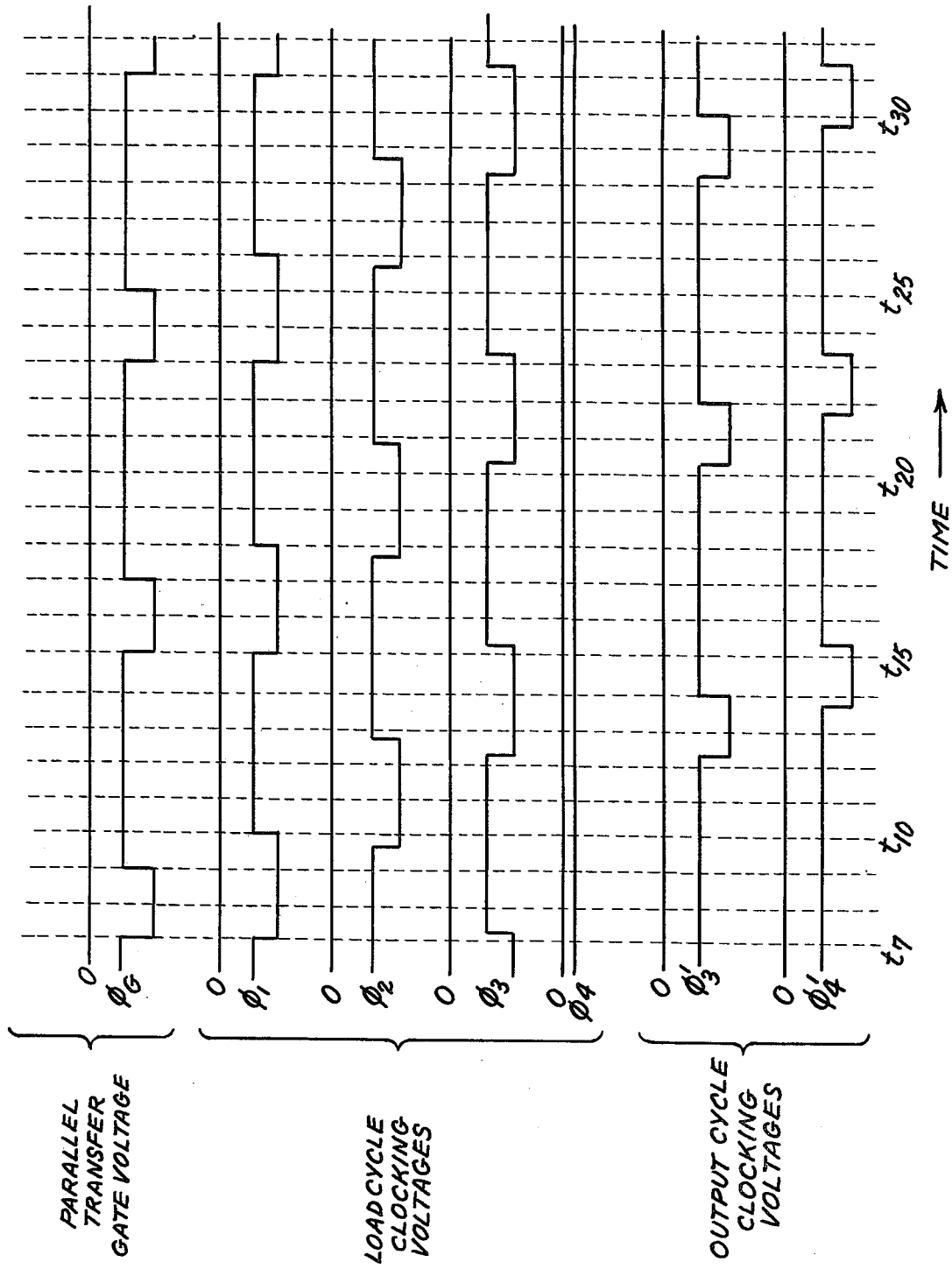

CHARGE TRANSFER MEMORY APPARATUS

The present invention relates to a two-dimensional array of charge transfer stages capable of two-dimensional transfer of charge between stages, and is particularly directed to apparatus for receiving and storing M sequences of analog signal samples, each sequence having N samples and providing an output of N sequences, each such output sequence having M samples.

The present invention is directed to improvements in the invention described and claimed in patent application Ser. No. 825,924, filed Aug. 19, 1977, and assigned to the assignee of the present invention.

An object of the present invention is to provide charge transfer memory apparatus of the character described which is relatively simple in structure and organization.

Another object of the present invention is to provide a charge transfer memory apparatus of the character described which requires relatively simple clocking waveforms for the operation thereof.

Another object of the present invention is to provide an organization of charge transfer stages in a two-dimensional array of charge transfer stages in which the lowest speed of transfer of charge occurs at the lowest clocking frequency.

In carrying out the invention in one illustrative embodiment thereof there is provided a substrate of semiconductor material including a plurality of major channel portions adjacent a major surface of the substrate. Each major channel portion is successively aligned to provide a parallel array of major channel portions. An insulating member is provided overlying the major surface and having a plurality of thin portions, each thin portion being in substantial registry with a respective major channel portion. A plurality of groups of electrodes are provided. Each group of electrodes being serially arranged on respective thin portion of the insulating member and overlying a respective major channel portion. Each group of electrodes forms with the substrate a plurality of stages of a respective charge transfer shift register. Each group of electrodes includes pluralities of the first, second, third and fourth electrodes with each stage including first, second, third and fourth successively coupled electrodes with the fourth electrode of each intermediate stage coupled to the first electrode of the next succeeding stage. A plurality of minor channel portions are provided adjacent the major surface of the substrate with each minor channel extending from a storage region underlying a third electrode of one stage of a shift register to a storage region underlying the first electrode of a corresponding stage of an adjacent successive shift register. Each of the third electrodes of the stages have a first portion which overlies an entrant part of a respective minor channel portion and each of the first electrodes of the stages have a second portion which overlies an exit part of a respective minor channel. The entrant and exit parts of each of said minor channel portions are contiguous.

Control means are provided for alternately applying a first and a second set of first, second, third and fourth voltages to the first, second, third and fourth electrodes, respectively. The first set of voltages including first, second and third voltages constituting a set of three-phase voltages of the same periodicity and with successively overlapping phases and a fourth voltage having a value which provides a barrier inhibiting the transfer of charge in regions of the main channel portions lying thereunder. Thus, a packet of charge in a storage region underlying a first electrode of a stage of the shift registers is successively transferred to the storage regions underlying the second and third electrodes thereof and thereafter transferred to the storage region underlying the first electrode in a corresponding stage of an adjacent succeeding shift register. The second set of voltages constituting a set of four-phase voltages of the same periodicity and with successively overlapping phases. The third voltage and the first voltage have nonoverlapping phases. Thus, a packet of charge in a storage region underlying a first electrode of a stage of a shift register is successively transferred to the storage regions underlying the second, third and fourth electrodes thereof and thereafter transferred to the storage region underlying the first electrode of a succeeding stage of the shift register.

Thus, when the first set of voltages is applied to the electrodes, each packet of a sequence of packets stored in a respective stage of a shift register is transferred to a respective corresponding stage of an adjacent successive shift register, and when the second set of voltages is applied to the electrodes, the packets of charge stored in a shift register are transferred from stage to stage in the shift register.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 8A through FIG. 8L show diagrams of voltage waveforms useful in explaining the operation of the apparatus of the present invention.

Figure 1:
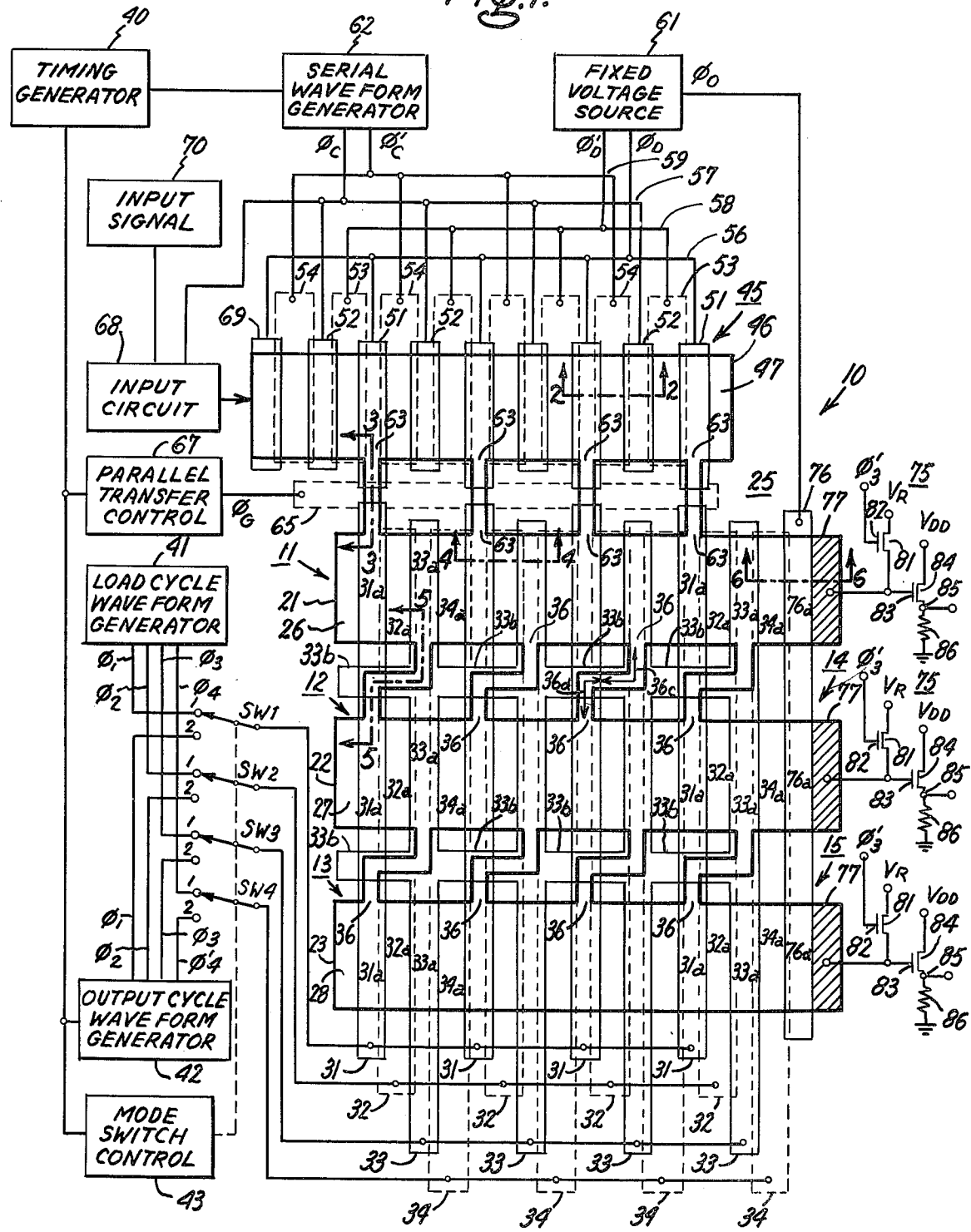
FIG. 1 is a schematic diagram of one embodiment of two-dimensional charge transfer memory apparatus in accordance with the present invention.
Figure 2:
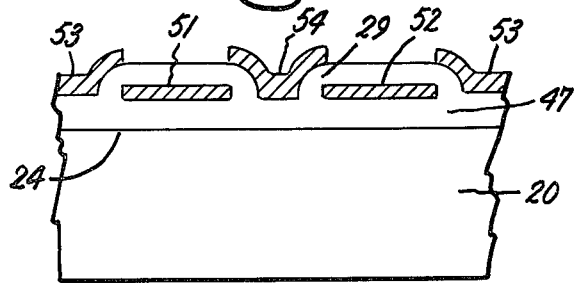
FIG. 2 shows a sectional view of the apparatus of FIG. 1 taken along section lines 2—2 of FIG. 1.
Figure 5:
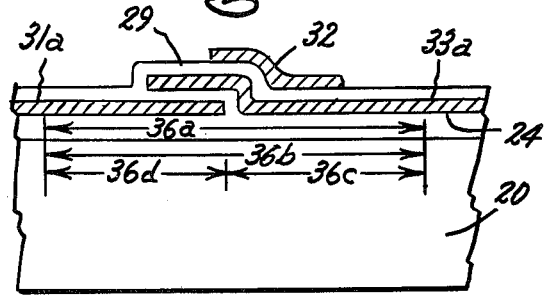
FIG. 5 shows a sectional view of the apparatus of FIG. 1 taken along section lines 5—5 of FIG. 1.
Figure 3:
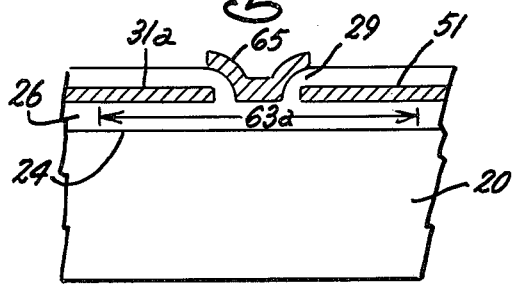
FIG. 3 shows a sectional view of the apparatus of FIG. 1 taken along section lines 3—3 of FIG. 1.
Figure 6:
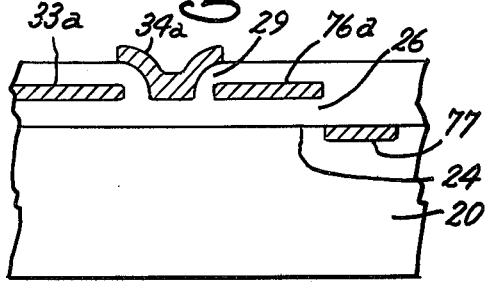
FIG. 6 shows a sectional view of the apparatus of FIG. 1 taken along section lines 6—6 of FIG. 1.
Figure 4:
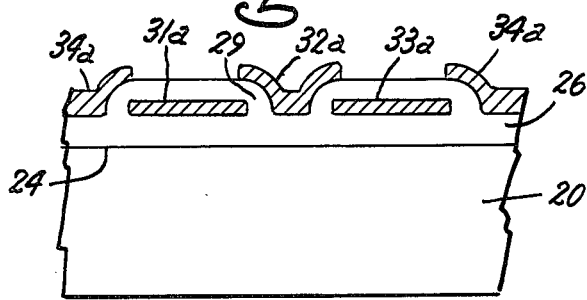
FIG. 4 shows a sectional view of the apparatus of FIG. 1 taken along section lines 4—4 of FIG. 1.

Reference is now made to FIGS. 1-6 which show charge transfer memory apparatus 10 in accordance with the present invention. The apparatus 10 comprises a plurality of m charge transfer shift registers each aligned along a horizontal or row direction. In the embodiment shown the number is equal to 3 and the three shift registers are designated 11, 12 and 13. Each of the charge transfer shift registers 11, 12 and 13 include a plurality of N stages. In the embodiment shown the number N is equal to 4. The apparatus 10 also includes rows 14 and 15 of interconnecting stages. Each stage of the first row shift register 11 is connected to the corresponding stage of the second shift register 12 by a respective interconnecting stage of row 14. Each stage of the second row shift register is connected to the corresponding stage of the third shift register 13 by a respective interconnecting stage of row 15. Thus, an array of rows and columns of charge transfer stages is provided. Each of the stages have identical sets of four electrodes. In response to a first set of clocking voltages applied to the sets of four electrodes charge packets are caused to move or transfer in the vertical or column direction. In response to a second set of clocking voltages applied to the sets of four electrodes charge packets in the stages are caused to transfer in a horizontal or row direction in each of the row shift registers.

The shift registers 11, 12 and 13 are formed on a semiconductor substrate 20 of N-type conductivity which has a first major channel portion 21, a second major channel portion 22 and a third major channel portion 23, each adjacent a major surface 24 of the substrate and each of the generally rectangular outline, the outlines of which are indicated by heavy lines in FIG. 1. Typically, the substrate may be silicon semiconductor material of suitable resistivity, for example, 4 ohm centimeters. Overlying the major surface of the substrate 20 is a thick insulating member 25 of silicon dioxide having a plurality of thin portions. A first thin portion 26 is of generally rectangular outline and lies in registry with the first major channel portion 21. A second thin portion 27 is also of generally rectangular outline and lies in registry with the second major channel portion 22. A third thin portion 28 is also of generally rectangular outline and lies in registry with the third major channel portion 26.

A plurality of first parallel lines 31 are provided, each extending generally perpendicularly to the long dimensions of the channel portions 21, 22 and 23. Portions of the lines 31 overlying the channel portions 21, 22 and 23 provide the first electrodes 31a of the row or horizontal shift registers 11, 12 and 13. A plurality of third parallel lines 33 are provided, each extending generally perpendicularly to long dimensions of the channel portions 21, 22 and 23. Portions of the lines 33 overlying the channel portions 21, 22 and 23 provide the third electrodes 33a of the row or horizontal shift registers 11, 12 and 13. Each of the first electrodes 31a is of uniform length in the direction of a length dimension of the major channel portions 21, 22 and 23. Similarly, each of the third electrodes 33a is of uniform length in the direction of the length dimension of the major channel portions 21, 22 and 23 and equal in length to the length of electrode 31a. The electrodes 31a and 33a are spaced apart by a distance equal substantially to the length of electrode 31a. On the thick insulation portion between the first thin insulation portion 26 and second thin insulation portion 27 and also between the second thin insulation portion 27 and the third thin insulation portion 28 are provided a plurality of conductive members 33b, each extending to the left and orthogonal from a respective third parallel line 33. Each of the conductive members 33b insulatingly overlies a respective first parallel line 31. A thin layer of insulation 29 is provided overlying the first and third parallel lines 31 and 33. A plurality of second parallel lines 32 are provided over the insulating layer 29. Each of the lines 32 is insulatingly spaced between a respective first line 31 and a respective succeeding third line 33. The second lines 32 overlie both the first lines 31 and the third lines 33. Portions of the line 32 overlying the channel portions 21, 22 and 23 provide the second electrodes 32a of the shift registers 11, 12 and 13. A plurality of fourth parallel lines 34 are provided over the insulating layer 29. Each of the lines 34 is insulatingly spaced between a respective third line 33 and a respective succeeding first line 31. The fourth lines 34 overlie both the third lines 33 and the first lines 31. Portions of the lines 34 overlying the channel portions 21, 22 and 23 provide the fourth electrodes 34a of the horizontal or row shift registers 11, 12 and 13. The second and fourth lines 32 and 34 are shown in dotted outline to illustrate with clarity the structure and organization of the memory apparatus. The sets of four lines 31, 32, 33 and 34 form a plurality of groups of electrodes 31a, 32a, 33a and 34a. Each group of electrodes is serially arranged on a respective thin portion of the insulating member 25 and overlying a respective major channel portion thereof to form with the substrate a plurality of stages of a respective charge transfer shift register. Each stage of a horizontal or row charge shift register includes a set of first, second, third and fourth successively coupled electrodes with the fourth electrode of each intermediate stage coupled to the first electrode of the next succeeding stage of the shift register.

A first plurality of thin recesses 36 are provided in the thick insulating member 25 underlying which are thin insulating portions 36a, each connecting a part of thin insulating portion 26 underlying the third electrode 33a of a stage of the first shift register with the part of the thin insulating portion 27 underlying the first electrode 31a of a corresponding stage of the second shift register 12. The outlines of the recesses are depicted in heavy lines. Similarly, a second plurality of thin recesses 36 are provided in the thick insulating member 25 underlying which are thin insulating portions 36a each connecting a part of the thin insulating portion 27 underlying the third electrode of a stage of the second shift register 12 with the part of the thin insulating portion 28 underlying the first electrode 31a of a corresponding stage of the third shift register 13. Underlying each of the thin recesses 36 in the substrate are minor channel portions 36b, the outlines of which are indicated by heavy lines in FIG. 1. Each of the minor portions 36b includes an entrant part 36c and an exit part 36d contiguous with entrant part 36c. The entrant part 36c of each of the minor channel portions 36b underlies a respective third line and an associated conductive member 33b, and the exit part 36d of each of the minor channel portions 36b underlies a respective one of the first lines 31. Thus, the third electrode of each stage of the first and second shift registers has a first portion which insulatingly overlies the entrant part 36c of the minor channel portion 36b and each of the first electrodes of a corresponding stage of an adjacent shift register has a second part which insulatingly overlies the exit part of the channel portion 36b. Thus, with a set of three-phase voltages with successively overlapping phases applied, respectively, to the first, second and third lines of the shift registers and with a fourth voltage applied to the fourth lines which provides barriers inhibiting transfer of charge thereunder, charge flow can be directed from stage to stage in the vertical or column direction of the array.

A load cycle waveform generator 41 provides a first set of four voltages designated $\phi_1$, $\phi_2$, $\phi_3$, and $\phi_4$ shown in FIGS. 8G, 8H, 8I and 8J, respectively. Voltages $\phi_1$, $\phi_2$ and $\phi_3$ constitute a set of three-phase voltages having successively overlapping phases. Voltage $\phi_4$ is a fixed voltage smaller in magnitude than the upper level of the three-phase voltages. An output cycle waveform generator 42 provides a set of four voltages $\phi_1$, $\phi_2$, $\phi_3'$ and $\phi_4'$. The $\phi_1$ and $\phi_2$ voltages developed by the generator 42 are identical to the voltages $\phi_1$ and $\phi_2$ developed by the generator 41 and are shown in FIGS. 8G and 8H. The voltages $\phi_3'$ and $\phi_4'$ are shown in FIGS. 8K and 8L. The voltages $\phi_1$, $\phi_2$, $\phi_3'$ and $\phi_4'$ constitute a set of four-phase voltages having successively overlapping phases. In this set of voltages the phases of voltage $\phi_1$ and $\phi_3'$ do not overlap. The first and second set of voltages from generators 41 and 42 are alternately applied to the four lines 31, 32, 33 and 34 through four mode switches SW1-SW4. Each of the mode switches includes a pair of stationary contacts 1 and 2 and a movable contact or arm. The stationary contacts 1 of switches SW1-SW4 are connected, respectively, to the $\phi_1$, $\phi_2$, $\phi_3$ and $\phi_4$ output lines of the generator 41. The stationary contacts 2 of the mode switches SW1-SW4 are connected, respectively, to the output lines of the generator 42 providing $\phi_1$, $\phi_2$, $\phi_3'$, and $\phi_4'$ voltages. The movable contact arms of switches SW1, SW2, SW3 and SW4, are connected, respectively, to lines 31, 32, 33 and 34. The mode switches SW1-SW4 are under the control of the mode switch control unit 43. The generators 41 and 42 and the mode switch control unit 43 are all synchronized by a timing generator 40.

When the first set of voltages $\phi_1$, $\phi_2$, $\phi_3$ and $\phi_4$ are applied to the four electrodes 31a, 32a, 33a and 34a of the stages of the shift registers 11, 12 and 13, potential barriers are set up in the major channel portions 21, 22 and 23 underlying the fourth electrodes 34a which inhibit transfer of charge in the row direction in these channels. The set of three-phase voltages $\phi_1$, $\phi_2$ and $\phi_3$ with overlapping phases causes charge introduced into a storage region underlying a first electrode 31a to be successively transferred to storage regions underlying the second electrode 32a and then to the storage region underlying the third electrode 33a. As the first voltage $\phi_1$ and the third voltage $\phi_3$ have overlapping phases, charge is then caused to move through the entrant part 36c and the exit part 36d of the minor channel portion 36b into the storage region underlying the first electrode of the corresponding stage of a succeeding adjacent shift register. Thus, charge is caused to be shifted in the column or vertical direction in the array of the stages.

When the second set of voltages $\phi_1$, $\phi_2$, $\phi_3'$ and $\phi_4'$ are connected, respectively, to the first electrode 31a, the second electrode 32a, the third electrode 33a and the fourth electrode 34a of each of the stages of the shift registers 11, 12 and 13, charge introduced into the storage region underlying a first electrode 31a is successively transferred to storage regions underlying the second electrode 32a, the third electrode 33a and the fourth electrode 34a and thereafter transferred to the storage region underlying the first electrode of a succeeding stage of the shift register. As the first voltage $\phi_1$ and the third voltage $\phi_3'$ do not overlap, charge transfer through the minor channel portions 36b is inhibited. Thus, charge transfer in the shift registers 11, 12 and 13 takes place only in the row or horizontal direction.

Packets of charge for insertion into the storage regions underlying the first electrodes 31a of the first row shift register 11 are provided by a serial shift register 45. The serial shift register 45 is formed on the substrate 20 and includes a major channel portion 46 adjacent the major surface 24 of the substrate of generally rectangular outline indicated by heavy lines. A thin portion 47 of insulation in the thick insulating member 25 overlying the substrate is provided in registry with the major channel portion 45. The major channel portion 46 and the thin insulating portion 47 are of generally rectangular outline and are indicated by heavy lines. A plurality of first electrodes 51 are provided on the insulating member 25 overlying the thin portion 47. Each of the first electrodes 51 is of uniform length in the direction of the length dimension of the channel portion 46. Each of the first electrodes 51 extends across both the thin insulating portion 47 and the bordering thick insulating portions of the insulating member 25. A plurality of second electrodes 52 is provided on the insulating member 25 overlying the thin portion 47. Each of the second electrodes 52 is of uniform length in the direction of the length dimension of the channel portion 47 and equal to the uniform length of the first electrodes 51. Each of the electrodes 52 extends across both the thin insulating portion 47 and the bordering thick insulating portions of the insulating member 25. An insulating layer 29 is provided over the electrodes 51 and 52. A plurality of first transfer electrodes 53 are provided over the insulating layer 29. Each of the first transfer electrodes 53 is insulatingly spaced between a respective second electrode 52 and an adjacent succeeding first electrode 51 and overlying these electrodes. A plurality of second transfer electrodes 54 are provided over the insulating layer 29. Each of the second transfer electrodes 54 is insulatingly spaced between a respective first electrode 51 and an adjacent succeeding second electrode 52 and overlying these electrodes. Each of the transfer electrodes 53 and 54 is of substantially uniform extent in the direction of the length of the channel portion 46 and extends over the thin insulating portion 47 of the insulating member 25 as well as the bordering thick insulating portions thereof. The first and second transfer electrodes 53 and 54 are shown in dotted lines to illustrate with clarity the structure and organization of the serial shift register 45.

All of the first electrodes of the serial shift register 45 are connected to line 56 to which a $\phi_D$ voltage is supplied from a fixed voltage source 61. All of the second electrodes 52 of the serial shift register 45 are connected to line 57 to which $\phi_C$ voltage is supplied from a serial waveform generator 62. All of the first transfer electrodes 53 of the serial shift register 45 are connected to a $\phi_D'$ line 58 to which a $\phi_D'$ voltage is supplied from fixed voltage source 61. All of the second transfer electrodes 54 of the serial shift register 45 are connected to a $\phi_C$ line 59 to which a $\phi_C'$ voltage is applied from serial waveform generator 62. The $\phi_C$, $\phi_D$, $\phi_C'$, and $\phi_D'$ voltage waveforms are shown in FIGS. 8A-8D, respectively.

A plurality of thin recesses 63 are provided in the thick insulating member 25 underlying which are thin insulating portions 63a, each connecting a part of the thin insulating portion 47 with a respective part of the thin insulating portion 26 underlying the first electrodes 31a of the first row shift register 11. The outlines of the recesses are depicted in heavy lines. The first or $\phi_D$ electrodes 51 of the serial shift register 45 extend into the recesses 63 and overlie a first part of the thin insulating portions 63a thereof. Similarly the first electrodes 31a of the first row shift register 11 extend into the recesses 63 and overlie a second part of the thin insulating portions 63a. The first and second parts of the insulating portion 63a are separated by an intermediate part. Thus, gaps are provided between the first electrodes of the serial shift register 45 and the first electrodes 31a of the first row shift register 11. A parallel transfer gate or line 65 is provided on the thick insulating portion 25 between the thin insulating portions 47 and 26 and overlying the gaps between electrodes 51 and electrodes 31a. The parallel transfer gate 65 is connected to parallel transfer control circuit 67 which provides thereto a parallel transfer gate voltage $\phi_G$. When a suitable gate potential is applied to the gate electrode 65 a conduction channel is formed in the underlying semiconductor substrate which enables transfer of charge from the first storage regions underlying the first electrodes 51 of the serial shift register 45 to first storage regions underlying the first electrodes 31a of the first row shift register 11. The parallel transfer gate voltage is shown in FIG. 8E and also in FIG. 8F. The parallel transfer control unit 67 is synchronized with the timing generator 40.

Each stage of the serial shift register 45 includes a $\phi_D$ storage region underlying a $\phi_D$ electrode 51 and a $\phi_C$ storage region underlying a $\phi_C$ electrode 52. The $\phi_D$ voltage applied to the $\phi_D$ electrode is fixed. The $\phi_C$ voltage applied to the $\phi_C$ electrode cycles between a high level and a low level, above and below the $\phi_D$ voltage. When the $\phi_C$ voltage is at its high level, charge transfer is enabled from the $\phi_C$ storage region to the $\phi_D$ storage region, and conversely, when the $\phi_C$ voltage is at its low level charge, transfer from the $\phi_D$ storage region to the $\phi_C$ storage region is enabled. Each stage also includes a $\phi_D'$ electrode 53 to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 54 to which is applied a $\phi_C'$ voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer of charge from a $\phi_D$ storage region to a $\phi_C$ storage region.

Packets of charge for insertion into the serial shift register 45 are generated by an input circuit 68 in a storage region underlying storage electrode 69. The storage electrode 69 overlies the thin insulation portion 47 of shift register 45 and underlies the first $\phi_C'$ electrode 54 of the first stage of shift register. The same potential is applied to electrode 69 as is applied to the first electrodes 51, namely, $\phi_D$ voltage. In response to an input signal, for example, an analog signal from a source 70, and also in response to clocking waveform voltage $\phi_C$ the input circuit 68 develops packets of charge which represent samples of the input signal and develops these packets at the periodicity of the serial waveform voltage $\phi_C$. As packets are developed in the storage region underlying the electrode 69 they are periodically clocked into the shift register from stage to stage. One input circuit for providing a sequence of packets of charge in response to an analog input signal and inserting the packets into serial charge transfer shift register is described in connection with FIGS. 2 and 3 of patent application Ser. No. 787,915, filed Apr. 15, 1977 and assigned to the assignee of the present invention.

Figure 7:
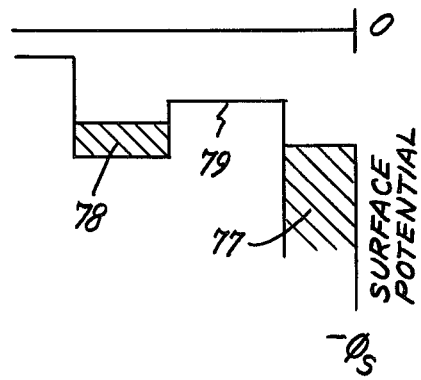
FIG. 7 is a diagram of semiconductor surface potential versus distance along the semiconductor surface of the structure of FIG. 6 useful in explaining the manner in which quantities of charge or packets are sensed or read out in the apparatus of FIG. 1.

Packets of charge transferred in the horizontal or row direction along each of the shift registers 11, 12 and 13 are sensed at respective output circuits 75. The output circuit 75 includes a common conductor or line 76 overlying the thin insulation portions 26, 27 and 28 and insulatingly underlying conductive line 34. Portions of the line 76 overlying the channel portions 21, 22 and 23 provide the common electrodes 76a of the shift registers 21, 22 and 23. The common line 76 is connected to a voltage $\phi_0$ supplied by the fixed voltage source 61. The voltage $\phi_0$ is set at a value intermediate the high and low levels of the voltage of $\phi_3'$ and $\phi_4'$. A region of P-type conductivity 77 is provided in each of the major channel portions 21, 22 and 23. An edge of the P-type region 77 is in registry with an adjacent edge of a common electrode 76a. Packets of charge transferred in the horizontal direction in the shift registers 11, 12 and 13 are sensed in the P-type regions 77 by precharging these P-type regions to a potential and floating them and thereafter transferring charge into them and sensing the change in potential produced thereby. The precharge and float circuit comprises a transistor 81 having its source to drain conduction path connected between the P-type region 77 and a source of precharge voltage $V_R$. The gate 82 of the transistor 81 is connected to a $\phi_3'$ voltage line. During the period of time voltage $\phi_3'$ is at its low level, the transistor 81 is turned on and a precharge voltage is applied to the P-type region 77. The precharge voltage is set to lie below the surface potential of the region underlying electrode 76a with fixed voltage $\phi_0$ applied thereto. When the voltage $\phi_3'$ rises to its high level, the transistor 81 is turned off and the region 77 is floated. During the period of time voltage $\phi_4'$ is at its low level and voltage $\phi_3'$ is at its high level, charge is transferred from the storage regions underlying the third storage electrodes to storage regions underlying the fourth electrodes 34a. This condition is shown in FIG. 7. FIG. 7 shows the variation in surface potential of the semiconductor substrate with a packet of charge 78 in the storage region underying the fourth storage electrode 34a just prior to the change in potential on the fourth electrode 34a from the low level of $\phi_4'$ to the high level thereof. When this change accurs, charge is caused to transfer or flow over the potential barrier 79 underlying the common electrode 76a into the floated P-type region 77. The change in voltage on the region 77 is applied to the gate 83 of transistor 84 connected as a source follower in which the source 85 is connected through a source resistance 86 to ground and in which the drain is connected to drain voltage $V_{DD}$. A voltage proportional to the packet of charge transferred to the precharge and floated P-type region 77 appears across the source resistance 86.

The operation of the memory apparatus of FIG. 1 will now be explained in connection with the wave form diagrams of FIGS. 8A–8L. The manner in which sequences of packets of charge are inserted into the serial shift register 45, thereafter transferred in parallel to the first, second and third shift registers 11, 12 and 13 will be described and then the manner in which each sequence of packets in the row shift register 11, 12 and 13 is transferred in the row direction for readout will be described. First, the manner in which the array is loaded from the serial shift register will be described and then the manner in which output is obtained from the loaded array will be described. In the loading mode, the mode switches SW1-SW4 are set by the mode switch control unit 43 so that the moveable arms thereof engage stationary contacts 1 thereof. In this mode a first set of voltages shown in FIGS. 8G–8J are applied respectively to the first, second, third and fourth electrodes of the shift registers 11, 12 and 13. The fourth voltage shown in FIG. 8J applied to the fourth electrodes 34a sets up potential barriers in the major channel portions 21 which inhibit the transfer of charge therethrough. The $\phi_1$, $\phi_2$ and $\phi_3$ voltages applied respectively to the first, second and third electrodes are a set of three phase voltages having overlapping phases. For example, during the time period $t_9$-$t_{10}$ $\phi_1$ voltage overlaps $\phi_2$ voltage, during the time interval $t_{12}$-$t_{13}$ the $\phi_3$ overlaps the $\phi_2$ voltage, and during time interval $t_{15}$-$t_{16}$ the third voltage $\phi_3$ overlaps the first voltage $\phi_1$. Thus, with such a set of overlapping three phase voltages applied to the first, second and third electrodes of each of the stages of the shift registers 11, 12 and 13, charge introduced into the storage regions underlying the first electrodes 31a is transferred to the storage regions underlying the second electrodes 32a and thence to the third electrodes 33a, whereupon charge is transferred through the minor channel portions 36b to the first storage regions underlying the corresponding stages in the successive adjacent shift register, as the first voltage $\phi_1$ overlaps the third voltage $\phi_3$.

The manner in which charge packets are generated by the input circuit 68 in response to an analog signal from the input signal source 70 has been described. For example, a packet of charge stored in the storage region underlying electrode 69 is transferred to the storage region underlying the $\phi_C$ electrode 52 during the time interval $t_1$-$t_2$ as at this interval the voltage $\phi_C$ has dropped to its low level and the $\phi_C'$ electrode, which has $\phi_C'$ voltage applied to it, has dropped to its low level. During the following interval $t_2$-$t_3$, the $\phi_C$ voltage rises to its high level and causes charge to be transferred to the next succeeding $\phi_D$ electrode 51. The cycle is repeated until a quantity of four packets of charge have been stored in successive $\phi_D$ storage regions underlying the $\phi_D$ electrodes 51 of the serial shift register 45. The loading of the serial shift register 45 occurs during the time period $t_1$-$t_9$. During the time period $t_7$-$t_9$, parallel transfer gate voltage $\phi_G$, as shown in FIG. 8E is applied to the parallel transfer gate 65. The gate voltage $\phi_G$ lowers the surface potential of the channel between the storage regions underlying electrodes 51 and the storage regions underlying the first electrodes 31a of shift register 11 thereby enabling charge in the storage regions underlying electrodes 51 to flow into the storage regions underlying electrodes 31a as during this interval of time the $\phi_1$ voltage applied to the first electrodes is at its low level. At time interval $t_9$ the gate voltage $\phi_G$ rises to its high level inhibiting the flow of charge from the serial shift register 45 into the row shift register 11 and enabling a second sequence of packets of charge to be serially introduced into the serial shift register 45 during the time interval $t_9$-$t_{17}$. In the meantime during this time interval $t_9$-$t_{17}$, the three phase voltages $\phi_1$, $\phi_2$ and $\phi_3$ have passed through a cycle of operation causing each of the charge packets that had been transferred into stages of the shift register 11 from the serial shift register 45 to be transferred to a respective corresponding stage of the second shift register 12. Thus, emptying the first shift register 11 and allowing the second sequence of packets in the serial shift register 45 to be transferred into the first shift register. In this manner, sequences of four packets are serially introduced into the serial shift register 45 and transferred in sequence to the first shift register 11, the second shift register 12 and the third shift register 13 until the first, second and third shift registers are filled by time $t_{26}$.

In response to a control signal from mode switch control unit 43 at time $t_{26}$ the mode switches SW1-SW4 are switched to their number 2 positions and accordingly a second set of voltages are applied to the electrodes of the stages of the shift registers 11, 12 and 13. The second set of voltages $\phi_1$, $\phi_2$, $\phi_3'$ and $\phi_4'$ are applied, respectively, to the first electrode 31a, the second electrode 32a, the third 33a and the fourth electrode 34a. The second set of voltages constitute a set of four phase voltages with overlapping phase. The third voltage and the first voltages have nonoverlapping phases. Thus, with these voltages applied to the electrodes of the stages of the shift registers 11, 12 and 13, charge is transferred from storage region to storage region of each stage to the storage region underlying the fourth electrodes and then to the succeeding stages in the horizontal or row direction thereof. As the third voltage and first voltage have nonoverlapping phases, charge is inhibited from transferring from a third storage region underlying electrode 33a through the minor channel portions 36b to storage regions underlying the first electrodes 31a of an adjacent successive register. The charges transferred in the row direction are sensed in the output circuit 75 by periodically precharging the P-type regions 77 during a $\phi_3'$ period of the four phase cycle of clocking voltages and at the end of the $\phi_4'$ phase of the cycle transferring the charges from the storage regions underlying the fourth electrodes 34a to the P-type regions 77 and sensing the change in voltage produced thereby.

Thus, in response to the first set of voltages applied to the sets of four electrodes, each packet of a sequence of packets stored in a row shift register is transferred to a respective corresponding stage of an adjacent shift register and when a second set of voltages is applied to the sets of four electrodes, the packets of a sequence of packets stored in a shift register are transferred from stage to stage in the shift register.

While the invention has been described in connection with memory array consisting of three horizontal or row shift registers, each register including four stages, it is apparent any desired number of row shift registers with each shift register including any desired number of stages made be readily constructed in accordance with the invention.

While in the embodiment of the invention described each of the stages has four electrodes and the first and second sets of voltages applied thereto include respectively a set of three phase-related voltages and a set of four pahse-related voltages, it is apparent that the stages can be constituted of other numbers of electrodes and other numbers of phase-related voltages. For example, each of the stages can be constituted of five electrodes. In this case the first set of voltages would include a set of four phase-related voltages and a fifth barrier producing voltage, and the second set of voltages would include a set of five phase-related voltages.

While the invention has been described in a specific embodiment, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. Charge transfer memory apparatus comprising a substrate of semiconductor material of one conductivity type including a plurality of major channel portions adjacent a major surface of said substrate, each successively aligned in a parallel array, an insulating member overlying said major surface and having a plurality of thin portions, each in substantial registry with a respective major channel portion, a plurality of groups of electrodes, each group of electrodes serially arranged on a respective thin portion of said insulating member and overlying a respective major channel portion, each group of electrodes forming with said substrate a plurality of stages of a respective charge transfer shift register, each stage including $n$ successively coupled electrodes, the $n^{th}$ electrode of each stage except the last of a shift register coupled to the first electrode of next succeeding stage of the shift register, where $n$ is an integral number greater than three, a plurality of minor channel portions adjacent said major surface of said substrate, each extending from a storage region underlying an $(n-1)^{th}$ electrode of one stage of a shift register to a storage region underlying the first electrode of corresponding stage of an adjacent successive shift register, each of said $(n-1)^{th}$ electrodes having a first portion overlying an entrant part of a respective minor channel portion and each of said first electrodes having a second portion overlying an exit part of a respective minor channel portion, the entrant and exit parts of each of said minor channel portions being contiguous, each of the first portions of said $(n-1)^{th}$ electrodes insulatingly overlying the second portion of a respective one of said first electrodes, control means for alternately applying a first and second set of $n$ voltages to the $n$ successively coupled electrodes of each stage, respectively, said first set of voltages including a set of $(n-1)$ phase-related voltages for effecting the successive transfer of charge in the storage regions underlying the first electrode to the storage region underlying the $(n-1)^{th}$ electrode of a stage and an $n^{th}$ voltage having a value which provides a barrier inhibiting the transfer of charge in regions of said main channel portions lying under the $n^{th}$ electrode of said $n$ successively coupled electrodes of each stage such that a packet of charge in a storage region underlying a first electrode of a stage of said shift registers is transferred to the storage region underlying the $(n-1)^{th}$ electrode thereof and thereafter transferred to the storage region underlying the first electrode in a corresponding stage of an adjacent succeeding shift register, said second set voltages including a set of $n$ phase-related voltages, the $(n-1)^{th}$ voltage and the first voltage of said second set of voltages having nonoverlapping phases, such that a packet of charge in a storage region underlying a first electrode of a stage of a shift register is successively transferred to the storage regions underlying the other electrodes thereof and thereafter transferred to the storage region underlying the first electrode of a succeeding stage of the shift register.

2. The apparatus of claim 1 including means for introducing a sequence of packets of charge into a shift register, each packet being introduced into a storage region underlying a respective first electrode thereof.

3. The apparatus of claim 2 in which are provided M charge transfer shift registers, in which each of said charge transfer shift registers includes N stages, and in which said sequence of packets of charge includes N packets of charge.

4. The apparatus of claim 1, in which $n$ is four, in which said first set of voltages consists of a set of three phase-related voltages and a fourth barrier producing voltage and, in which said second set of voltages consists of a set of four phase-related voltages.

* * * * *